United States Patent
Nakashiba

[19]
[11] Patent Number: 6,111,279
[45] Date of Patent: Aug. 29, 2000

[54] CCD TYPE SOLID STATE IMAGE PICK-UP DEVICE

[75] Inventor: Yasutaka Nakashiba, Tokyo, Japan

[73] Assignee: NEC Corporation, Tokyo, Japan

[21] Appl. No.: 09/152,254

[22] Filed: Sep. 14, 1998

[30] Foreign Application Priority Data

Sep. 24, 1997 [JP] Japan ................................. 9-258596

[51] Int. Cl.[7] ........................ H01L 27/148; H01L 29/768
[52] U.S. Cl. ........................ 257/222; 257/221; 257/233; 257/245; 257/249
[58] Field of Search ................................. 257/221, 222, 257/231–233, 245, 248, 249

[56] References Cited

U.S. PATENT DOCUMENTS

| | | | |
|---|---|---|---|
| 3,896,474 | 7/1975 | Amelio et al. | 257/232 |
| 4,024,514 | 5/1977 | Elmer et al. | 257/245 |
| 4,847,692 | 7/1989 | Tabei | 257/249 |
| 5,115,458 | 5/1992 | Burkey et al. | 257/221 |
| 5,210,433 | 5/1993 | Ohsawa et al. | 257/232 |
| 5,428,231 | 6/1995 | Tanaka et al. | 257/249 |
| 5,606,187 | 2/1997 | Bluzer et al. | 257/249 |
| 5,917,208 | 6/1999 | Hatano | 257/222 |

*Primary Examiner*—Gene M. Munson
*Attorney, Agent, or Firm*—McGinn & Gibb, P.C.

[57] ABSTRACT

A solid state image pick-up device is disclosed in which potential wells formed between adjacent ones of charge transfer electrodes of a vertical charge transfer portion thereof, formed between adjacent ones of charge transfer electrodes of a horizontal charge transfer portion and formed in a connecting region between the vertical and horizontal charge transfer portions are uniformalized. Impurity densities of regions between the charge transfer electrodes of the vertical charge transfer portion thereof, between the charge transfer electrodes of the horizontal charge transfer portion and in a connecting region between the vertical and horizontal charge transfer portions are set independently from each other on the basis of the inter-electrode distances and amplitudes and potentials of driving pulses supplied these electrodes such that these potential wells become equal to each other.

8 Claims, 11 Drawing Sheets

$\Phi_3 < \Phi_1 < \Phi_2$

CCD TYPE SOLID STATE IMAGE PICK-UP DEVICE

BACKGROUND OF THE INVENTION

1. Field of the Invention

The present invention relates to a CCD type solid state image pick-up device and, particularly, to a CCD solid state image pick-up device in which charge transfer electrodes of a vertical and horizontal charge transfer portions thereof are formed in a single layer structure.

2. Description of the Related Art

Owing to the recent development of fine manufacturing techniques, it has become possible to form respective charge transfer electrodes of a CCD type solid state image pick-up device with fine spaces therebetween and, owing to this fact, it becomes possible to form a charge transfer device having a single electrode structure with inter-electrode distance or space being 0.2 to 0.3 $\mu$m by etching an electrically conductive electrode material.

Since there is no overlapping portion between transfer electrodes of a single layer electrode structure of such charge transfer device, there are advantages that inter-electrode capacitance is small and that there is substantially no short-circuit occurs between electrodes. Further, since there is no need of the oxidation step for oxidizing electrode to form an inter-layer film necessary in the overlapping portions, there is another advantage that it is possible to use not only polysilicon but also metal film or its silicide film as electrode materials, with which it is possible to reduce the resistance of the charge transfer electrodes.

Figure 10:
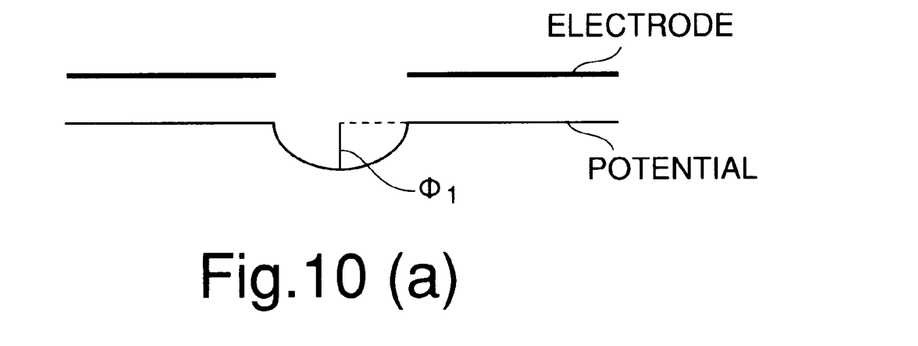
FIGS. 10(a) to 10(c) illustrate potential wells formed between electrodes.

However, since, in the charge transfer device having the single layer electrode structure, the respective charge transfer electrodes are arranged with spaces determined by the preciseness of etching, there may be a region covered by the charge transfer electrodes and a region which is not covered thereby and potential well may be formed in the uncovered region, as shown in FIG. 10($a$). The larger the depth of the potential well requires the larger the distance between adjacent electrodes as shown in FIG. 10($b$). Further, the configuration and depth of the potential well depend upon variation of potential difference between charge transfer electrodes and, when the potential difference is large, the potential well becomes shallow due to the potential modulation effect as shown in FIG. 10($c$).

Figure 11:
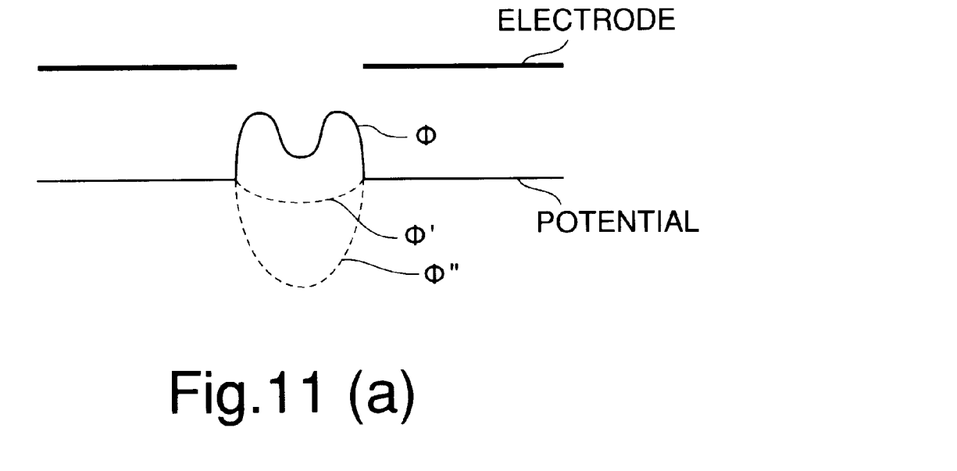
FIGS. 11(a) and 11(b) are illustrations explaining the difference in configuration of potential wells formed between electrodes dependently upon the amount of ion injection.

In order to make the potential well shallower, it may be considered to regulate the potential in the region in which the potential well is formed by injecting ion into the region. FIGS. 11($a$) and 11($b$) show variations of the potential well when such ion injection is performed, in which depicts potential when ion injection is too small, depicts potential when ion injection is suitable and epicts potential when ion injection is excessive.

As is clear from FIGS. 11($a$) and 11($b$), when the amount of ion injected is too small, the effect of reducing the depth of the potential well is short, while, when the amount of ion injected is too much, there may be a potential barrier formed. Therefore, it is necessary to inject an optimal amount of ion into such region. However, the optimal amount of ion depends upon the distance between adjacent electrodes as mentioned above as well as an amplitude of a drive pulse applied to the electrodes. Therefore, in a case where the inter-electrode distance in the vertical charge transfer portion is different from that in the horizontal charge transfer portion or the amplitude of the drive pulse applied to the electrodes of the vertical charge transfer portion is different from that of the horizontal charge transfer portion, the optimal amount of ion injection in the vertical charge transfer portion becomes different from that in the horizontal charge transfer portion.

For example, when the amount of ion injection in the vertical charge transfer portion is optimized, the amount of ion injection in the horizontal charge transfer portion becomes short, so that the reducing effect of depth of the potential well becomes insufficient and a portion of signal charge may be left not transferred, while, the amount of ion injection in the horizontal charge transfer portion is optimized, the amount of ion injection in the vertical charge transfer portion becomes excessive, so that the potential barrier is formed.

Therefore, a charge transfer device which can sufficiently reduce the depth of potential well without forming the potential barrier in both the vertical and horizontal charge transfer portions has been highly desired.

SUMMARY OF THE INVENTION

An object of the present invention is to provide a charge transfer device which can sufficiently reduce the depth of potential well without forming the potential barrier in both a vertical charge transfer portion and a horizontal charge transfer portion.

Another object of the present invention is to provide a solid state image pick-up device having superior charge transfer efficiency by uniformly reducing potential well formed between charge transfer electrodes of a vertical charge transfer portion, between charge transfer electrodes of a horizontal charge transfer portion and between the vertical and horizontal charge transfer portions.

In order to achieve the above objects, a solid state image pick-up device according to the present invention comprises a plurality of first diffusion regions arranged in a vertical direction, a plurality of second diffusion regions arranged in a horizontal direction, a plurality of vertical charge transfer electrodes each formed on an associated one of said first diffusion regions, a plurality of horizontal charge transfer electrodes each formed on an associated one of said second diffusion regions, a plurality of third diffusion regions having a first impurity concentration each of which is located between said first diffusion regions, and a plurality of fourth diffusion regions having a second impurity concentration different from said first impurity concentration each of which is located between said second diffusion regions.

BRIEF DESCRIPTION OF THE DRAWINGS

FIGS. 2($a$) to 2($g$) show an example of the manufacturing steps of the solid state image pick-up device shown in FIG. 1;

FIGS. 3($a$) to 3($g$) show another example of the manufacturing steps of the solid state image pick-up device shown in FIG. 1;

FIGS. 4($a$) to 4($f$) show a further example of the manufacturing steps of the solid state image pick-up device shown in FIG. 1;

FIGS. 6($a$) to 6($g$) show an example of the manufacturing steps of the solid state image pick-up device shown in FIG. 5;

FIGS. 7($a$) to 7($g$) show an example of the manufacturing steps of a solid state image pick-up device according to another embodiment of the present invention;

DETAILED DESCRIPTION OF THE PREFERRED EMBODIMENTS

Figure 1:
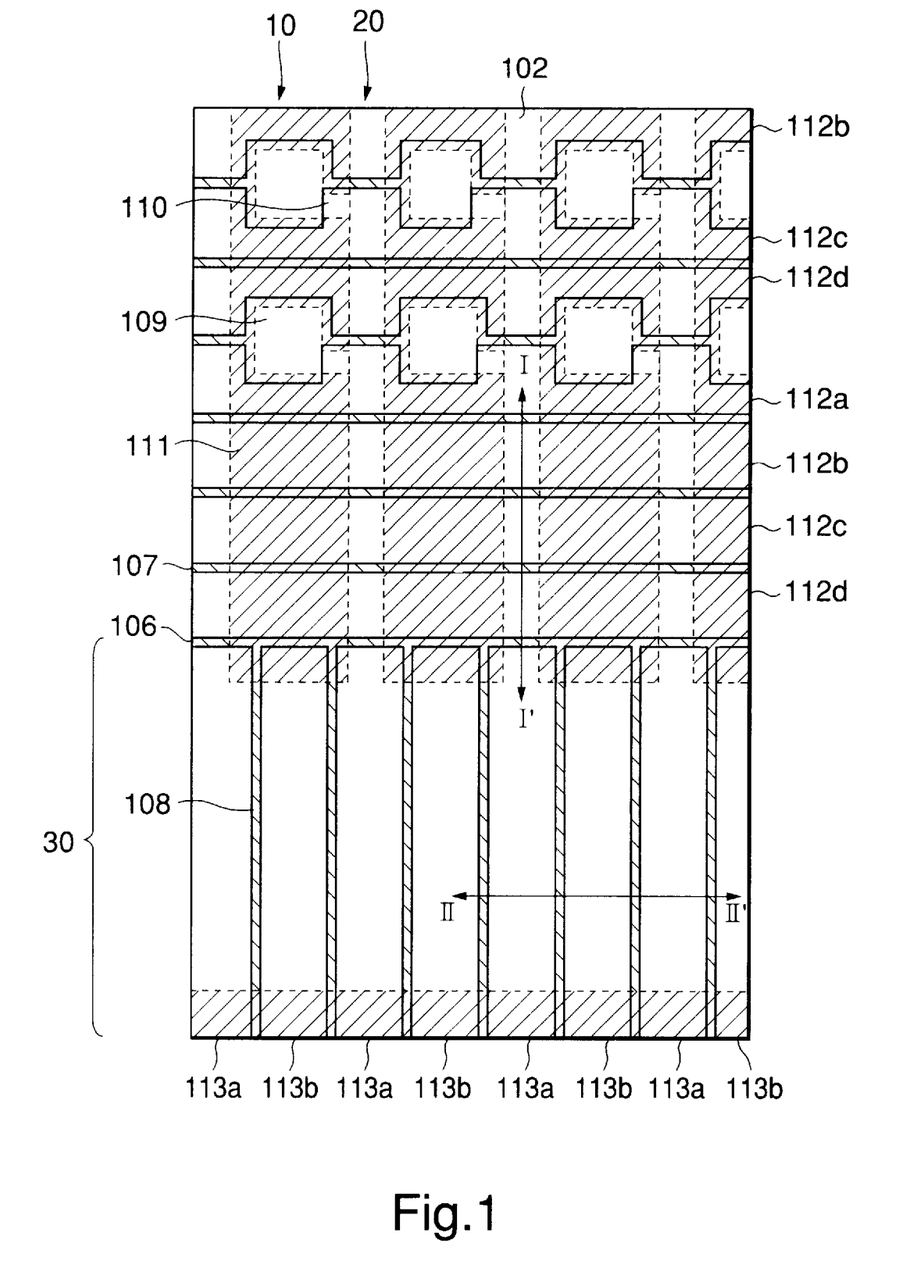
FIG. 1 is a plan view of a solid state image pick-up device according to an embodiment of the present invention.

Referring to FIG. 1 which is a plan view of a solid state image pick-up device according to an embodiment of the present invention, the solid state image pick-up device comprises an opto-electric converter 10, a vertical charge transfer portion 20 and a horizontal charge transfer portion 30. The vertical charge transfer portion 20 and the horizontal charge transfer portion 30 have a single layer structure. The vertical charge transfer portion 20 is driven by a drive pulse of 4-phase clock and transfers charge generated by the opto-electric converter 10 to the horizontal charge transfer portion 30. The horizontal charge transfer portion 30 is driven by a drive pulse of 2-phase clock and transfers charge transferred from the vertical charge transfer portion 20 to an output terminal which is not shown.

In FIG. 1, a reference numeral 102 depicts an N type semiconductor region which becomes the charge transfer portions, 106 a first N− type semiconductor region formed between charge transfer electrodes of the vertical charge transfer portion and the horizontal charge transfer portion, 107 a second N− type semiconductor region formed between charge transfer electrodes of the vertical charge transfer portion, 108 a third N− type semiconductor region formed between charge transfer electrodes of the horizontal charge transfer portion, 109 an N type semiconductor region which becomes the opto-electric converter, 110 a P type semiconductor region which becomes a signal read portion, 111 a P+ type semiconductor region which becomes an element isolation portion, 112a, 112b, 112c and 112d charge transfer electrodes of the vertical charge transfer portion and 113a and 113b charge transfer electrodes of the horizontal charge transfer portion.

The charge transfer electrodes 112a to 112d of the vertical charge transfer portion are applied with drive pulses having different phases and the charge transfer electrodes 113a and 113b of the horizontal charge transfer portion are applied with drive pulses having different phases. Incidentally, the charge transfer electrodes of each of the vertical charge transfer portion and the horizontal charge transfer portion are formed with a space of about 0.3 μm between adjacent electrodes.

Now, the manufacturing steps of the solid state image pick-up device shown in FIG. 1 will be described with reference to a cross section of the vertical charge transfer portion taken along a line I–I' and a cross section of the horizontal charge transfer portion taken along a line II–II'.

Figure 2:
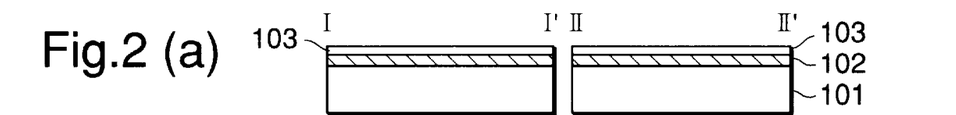

First, the N type semiconductor region 102 having impurity density of about $1.0 \times 10^{17}$ cm$^{-3}$ is formed in the P type semiconductor substrate having impurity density of about $1.0 \times 10^{16}$ cm$^{-3}$. Then, a first oxide film 103 having thickness of about 30 nm is formed by thermal oxidation of the N type semiconductor region (FIG. 2(a)).

Then, a portion of the first oxide film 103 formed on the horizontal charge transfer portion 20 and a portion of the first oxide film 103 formed on the vertical charge transfer porion 30 are removed by photolithography and etching. Thereafter, a second oxide film 104 having thickness of about 60 nm is formed by thermal oxidation. In this case, the remaining portion of the first oxide film 103 on the horizontal charge transfer portion 30 is further grown to a thickness of about 70 nm.

Thus, the whole surface of the vertical charge transfer portion 20 is covered by the second oxide film 104 having thickness of about 60 nm and a portion of the surface of the horizontal charge transfer portion 30 from which the first oxide film 103 is removed is covered by the second oxide film 104 having thickness of about 60 nm and the remaining portion thereof from which the first oxide film 103 is not removed is covered by the first oxide film 103 grown to the thickness of about 70 nm.

Then, a polysilicon film is formed on the first oxide film 103 and the second oxide film 104 and, by patterning the polysilicon film, charge transfer electrodes 112 and charge transfer electrodes 113 are formed on the vertical charge transfer portion 20 and the horizontal charge transfer portion 30, respectively. A space between adjacent charge transfer electrodes 112 and a space between adjacent charge transfer electrodes 113 are about 0.3 μm, respectively. Further, as shown in the cross sections taken along the line I–I', a space between the last charge transfer electrode 112 of the vertical charge transfer portion 20 and the charge transfer electrode 113 of the horizontal charge transfer portion 30 is also about 0.3 μm (FIG. 2(b)).

Thereafter, a mask material is formed on the whole surface of the wafer and a portion thereof corresponding to the area between the last charge transfer electrode 112 of the vertical charge transfer portion 20 and the charge transfer electrode 113 of the horizontal charge transfer portion 30 is selectively removed by photolithography to form a mask 116a. Thereafter, P type impurity ion (for example, boron ion) is injected into the N type semiconductor region 102 by using the mask 116a. Thus, the first N− type semiconductor region 106 having impurity density of about $9.7 \times 10^6$ cm$^{-3}$ is formed (FIG. 2(c)).

Further, a mask material is further formed on the whole surface of the wafer and a portion thereof corresponding to the areas between the adjacent charge transfer electrodes 112 of the vertical charge transfer portion 20 are selectively removed by photolithography to form a mask 116b. Thereafter, P type impurity ion (for example, boron ion) is injected into the N type semiconductor region 102 by using the mask 116b. Thus, the second N− type semiconductor region 107 having impurity density of about $9.5 \times 10^{16}$ cm$^{-3}$ is formed (FIG. 2(d)).

Further, a mask material is further formed on the whole surface of the wafer and a portion thereof corresponding to the areas between the adjacent charge transfer electrodes 113 of the horizontal charge transfer portion 30 are selectively removed by photolithography to form a mask 116c. Thereafter, P type impurity ion (for example, boron ion) is injected into the N type semiconductor region 102 by using the mask 116c. Thus, the third N− type semiconductor region 108 having impurity density of about $9.0 \times 10^{16}$ cm$^{-3}$ is formed (FIG. 2(e)).

Thereafter, an inter-layer insulating film 114 is formed by using known technique (FIG. 2(f)) and the charge transfer device of the present invention is completed by connecting the charge transfer electrodes 112a to 112d of the vertical charge transfer portion and the charge transfer electrodes 113a and 113b of the horizontal charge transfer portion by a metal wiring 115 through the inter-layer insulating film 114 (FIG. 2(g)).

In general, in driving such solid state image pick-up device, the charge transfer electrodes 112a to 112d of the vertical charge transfer portion 20 are supplied with drive pulses having amplitudes of about 0~8V and having phase differences of 90 degrees from each other, respectively, and the charge transfer electrodes 113a and 113b of the horizontal charge transfer portion 30 are supplied with drive pulses having amplitudes of 0~5V and having phase difference of 180 degrees, respectively.

As mentioned, the drive pulse applied to the charge transfer electrodes 112 of the vertical charge transfer portion 20 and the drive pulse applied to the charge transfer electrodes 113 of the horizontal charge transfer portion 30 are different in both the amplitude and potential from each other. Therefore, potential wells formed between the charge transfer electrodes 112 of the vertical charge transfer portion 20 and potential wells formed between the charge transfer electrodes 113 of the horizontal charge transfer portion 20 are different in depth. Further, the depth of potential well formed between the last charge transfer electrode 112 of the vertical charge transfer portion 20 and the charge transfer electrode 113 of the horizontal charge transfer portion 30 is also different from the potential wells between the charge transfer electrodes 112 as well as those between the charge transfer electrodes 113.

According to the solid state image pick-up device of the present invention, the first N– type semiconductor region 106 having impurity density of about $9.7 \times 10^{16}$ cm$^{-3}$ is formed between the charge transfer electrodes which are the connecting region between the vertical charge transfer portion 20 and the horizontal charge transfer portion 30, the second N– type semiconductor region 107 having impurity density of about $9.5 \times 10^{16}$ cm$^{-3}$ is formed between the charge transfer electrodes 112 of the vertical charge transfer portion 20 and the third N– type semiconductor region 108 having impurity density of about $9.0 \times 10^{16}$ cm$^{-3}$ is formed between the charge transfer electrodes 113 of the horizontal charge transfer portion 30. Therefore, even when the amplitude and potential of the drive pulses applied to the charge transfer electrodes of the vertical charge transfer portion 20 and the horizontal charge transfer portion 30 are different, uniform potential wells are formed in all of the regions between the charge transfer electrodes 112 of the vertical charge transfer portion 20, between the charge transfer electrodes 113 of the horizontal charge transfer portion 30 and the connecting region between the vertical charge transfer portion 20 and the horizontal charge transfer portion 30. Thus, the charge transfer efficiency is improved.

Now, the manufacturing steps of the solid state image pick-up device shown in FIG. 1 will be described with reference to cross sections of the vertical charge transfer portion taken along a line I–I' in FIGS. 3(a) to 3(g) and those of the horizontal charge transfer portion taken along a line II–II' in the same figures.

The steps of forming the charge transfer electrodes 112 and 113 (FIGS. 3(a) and 3(b)) are the same as those shown in FIGS. 2(a) and 2(b) and, therefore, detailed description thereof is omitted.

After the charge transfer electrodes 112 and 113 are formed through the steps shown in FIGS. 3(a) and 3(b), P type impurity (for example, boron) is ion injected to the N type semiconductor region 102 without forming a mask layer and, thus, the first N– type semiconductor region 106 having impurity density of about $9.7 \times 10^{16}$ cm$^{-3}$ is formed between the charge transfer electrodes 112 and 113 (FIG. 3(c)).

Then, a mask material is formed on the whole surface of the wafer and the portion of the mask material corresponding to portions between the charge transfer electrodes 113 of the vertical charge transfer portion 20 and the portion of the mask material corresponding to portions between the charge transfer electrodes 112 of the horizontal charge transfer portion 30 are selectively removed by photolithography to form the mask 116a. Thereafter, P type impurity (for example, boron) is ion injected to the N type semiconductor region 102 by using the mask 116a as a mask. Thus, the second N– type semiconductor region 107 having impurity density of about $9.5 \times 10^{16}$ cm$^{-3}$ is formed (FIG. 3(d)).

Further, a mask material is further formed on the whole surface of the wafer and a portion thereof corresponding to the areas between the adjacent charge transfer electrodes 113 of the horizontal charge transfer portion 30 are selectively removed by photolithography to form a mask 116b. Thereafter, P type impurity (for example, boron) is ion injected into the N type semiconductor region 102 by using the mask 116b. Thus, the third N– type semiconductor region 108 having impurity density of about $9.0 \times 10^{16}$ cm$^{-3}$ is formed (FIG. 3(e)).

Thereafter, an inter-layer insulating film 114 is formed by using known technique (FIG. 3(f)) and the charge transfer device of the present invention is completed by connecting the charge transfer electrodes 112a to 112d of the vertical charge transfer portion and the charge transfer electrodes 113a and 113b of the horizontal charge transfer portion by a metal wiring 115 through the inter-layer insulating film 114 (FIG. 3(g)).

By performing the ion injection staring at the region whose density of impurity to be introduced is small to the region whose density of impurity to be introduced is large, in the sequence, in this manner, one of the steps of photolithography can be removed.

Another example of the manufacturing steps of the solid state image pick-up device shown in FIG. 1 will be described with reference to cross sections of the vertical charge transfer portion taken along a line I–I' in FIGS. 4(a) to 4(f) and those of the horizontal charge transfer portion taken along a line II–II' in the same figures.

The steps of forming the charge transfer electrodes 112 and 113 (FIGS. 4(a) and 4(b)) are the same as those shown in FIGS. 2(a) and 2(b) and, therefore, detailed description thereof is omitted.

After the charge transfer electrodes 112 and 113 are formed through the steps shown in FIGS. 4(a) and 4(b), a mask material is formed on the whole surface of the wafer and a portion thereof corresponding to the area between the last charge transfer electrode 112 of the vertical charge transfer portion 20 and the charge transfer electrode 113 of the horizontal charge transfer portion 30 is selectively removed by photolithography to form a mask 116a. Thereafter, P type impurity (for example, boron) is ion injected to the N type semiconductor region 102 by using the mask 116a. Thus, the first N– type semiconductor region 106 having impurity density of about $9.7 \times 10^{16}$ cm$^{-3}$ is formed (FIG. 4(c)).

Then, a mask material is formed on the whole surface of the wafer again and the portion of the mask material corresponding to portions between the charge transfer electrodes 113 of the horizontal charge transfer portion 30 is selectively removed by photolithography to form the mask 116b. Thereafter, P type impurity (for example, boron) is ion injected to the N type semiconductor region 102 by using the mask 116b as a mask. Thus, the second N– type semiconductor region 108 having impurity density of about $9.0×10^{16}$ cm$^{-3}$ is formed (FIG. 4(d)).

Thereafter, an inter-layer insulating film 114 is formed by using known technique (FIG. 4(e)) and the charge transfer device of the present invention is completed by connecting the charge transfer electrodes 112a to 112d of the vertical charge transfer portion and the charge transfer electrodes 113a and 113b of the horizontal charge transfer portion by a metal wiring 115 through the inter-layer insulating film 114 (FIG. 4(f)).

Thus, in a case where there is no practical problem if the impurity density between the charge transfer electrodes 112 of the vertical charge transfer portion 20 and that between the charge transfer electrodes 113 of the horizontal charge transfer porion 30 are the same, it is possible to simplify the manufacturing of the device by forming these regions simultaneously by one common ion injection step. That is, according to this method, the setting of conditions of ion injection in forming the regions 106 and 108 which are formed by one ion injection, respectively, as in the method shown in FIGS. 2(a) to 2(g) is easy and one of the photolithography steps for ion injection can be removed compared with the method shown in FIGS. 3(a) to 3(g).

Figure 5:
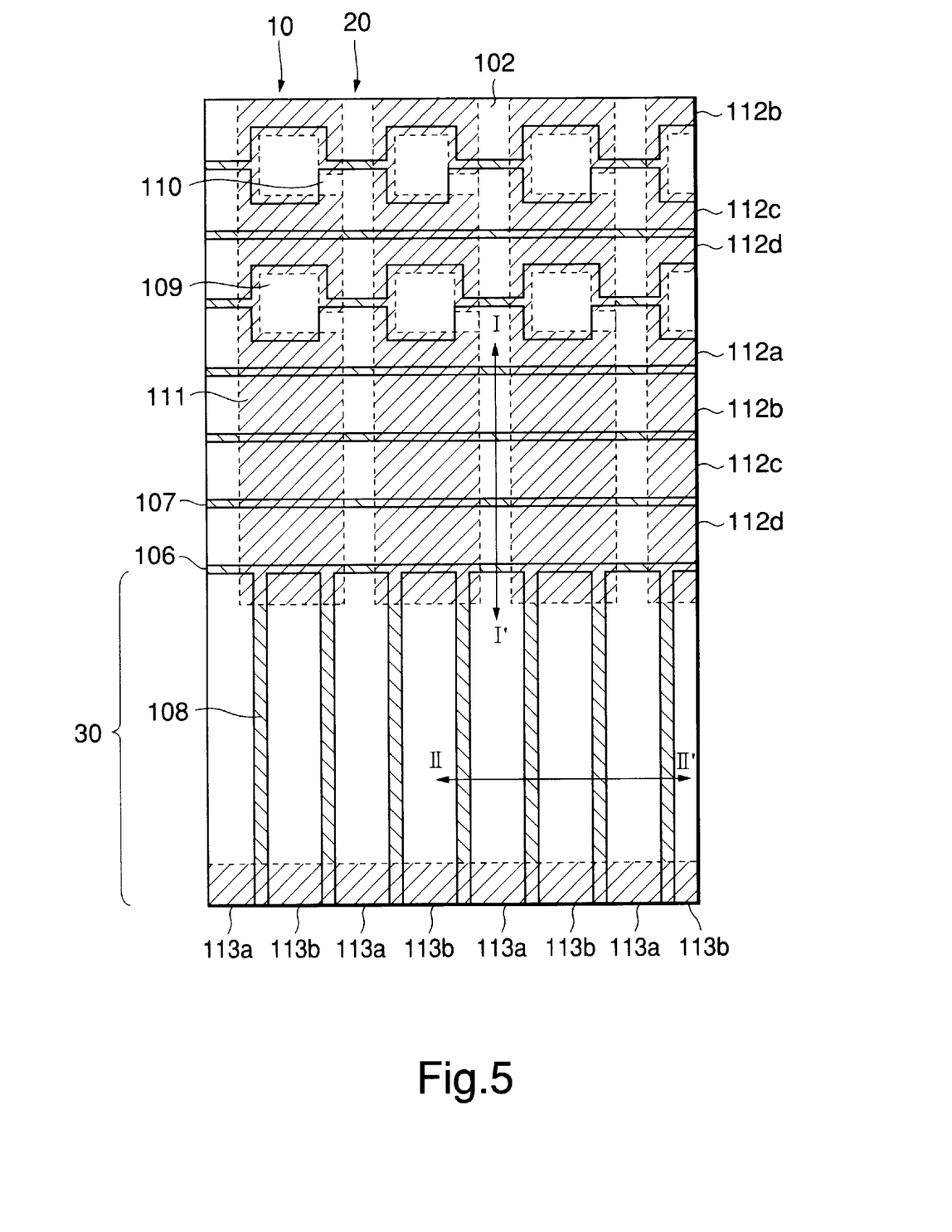
FIG. 5 is a plan view of a solid state image pick-up device according to another embodiment of the present invention.
Figure 6:
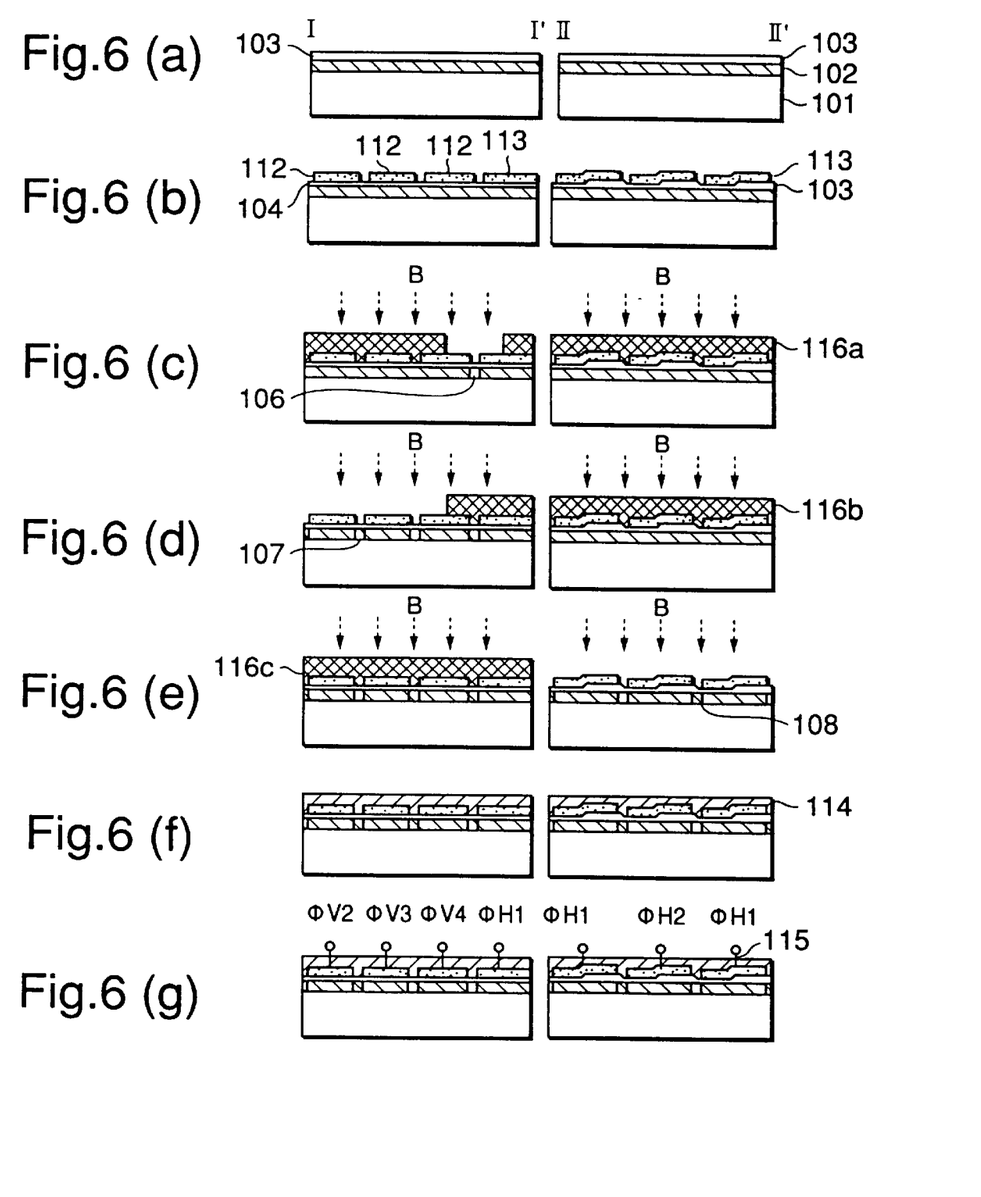

Now, a solid state image pick-up device according to another embodiment of the present invention will be described with reference to FIG. 5. In FIG. 5, the solid state image pick-up device comprises an opto-electric converter 10, a vertical charge transfer portion 20 and a horizontal charge transfer portion 30. The vertical charge transfer portion 20 and the horizontal charge transfer portion 30 are formed as having a single layer structure. The vertical charge transfer portion 20 is driven by a drive pulse of 4-phase clock and transfers charge generated by the opto-electric converter 10 to the horizontal charge transfer portion 30. The horizontal charge transfer portion 30 is driven by a drive pulse of 2-phase clock and transfers charge transferred from the vertical charge transfer portion 20 to an output terminal which is not shown.

The solid state image pick-up device shown in FIG. 5 differs from the solid state image pick-up device shown in FIG. 1 in that the space between the charge transfer electrodes 112 of the vertical charge transfer portion 20 is different from that between the charge transfer electrodes 113 of the horizontal charge transfer portion 30. That is, the space between the charge transfer electrodes 112 of the vertical charge transfer portion 20 is about 0.3 $\mu$m while that between the charge transfer electrodes 113 of the horizontal charge transfer portion 30 is about 0.5 $\mu$m. Incidentally, the space between the last charge transfer electrode 112 and the charge transfer electrode 113 of the horizontal charge transfer portion 30 is about 0.3 $\mu$m.

By setting the space between the charge transfer electrodes 113 of the horizontal charge transfer portion 30 wider than the space between the charge transfer electrodes 112 of the vertical charge transfer portion 20 as mentioned above, the capacitance between the charge transfer electrodes 113 is made smaller, so that electric power consumed by the horizontal charge transfer portion whose driving frequency is high is reduced.

Now, the manufacturing steps of the solid state image pick-up device shown in FIG. 5 will be described with reference to FIGS. 6(a) to 6(g) showing a cross section of the vertical charge transfer portion taken along a line I–I' and a cross section of the horizontal charge transfer portion taken along a line II–II'.

First, the N type semiconductor region 102 having impurity density of about $1.0×10^{17}$ cm$^{-3}$ is formed in the P type semiconductor substrate having impurity density of about $1.0×10^{16}$ cm$^{-3}$. Then, a first oxide film 103 having thickness of about 30 nm is formed by thermal oxidation of the N type semiconductor region (FIG. 6(a)).

Then, a portion of the first oxide film 103 formed on the horizontal charge transfer portion 20 and a portion of the first oxide film 103 formed on the vertical charge transfer porion 30 are removed by photolithography and etching. Thereafter, a second oxide film 104 having thickness of about 60 nm is formed by thermal oxidation. In this case, the remaining portion of the first oxide film 103 on the horizontal charge transfer portion 30 is further grown to a thickness of about 70 nm.

Thus, the whole surface of the vertical charge transfer portion 20 is covered by the second oxide film 104 having thickness of about 60 nm and a portion of the surface of the horizontal charge transfer portion 30 from which the first oxide film 103 is removed is covered by the second oxide film 104 having thickness of about 60 nm and the remaining portion thereof from which the first oxide film 103 is not removed is covered by the first oxide film 103 grown to the thickness of about 70 nm.

Then, a polysilicon film is formed on the first oxide film 103 and the second oxide film 104 and, by patterning the polysilicon film, charge transfer electrodes 112 are formed in the vertical charge transfer portion 20 and charge transfer electrodes 113 are formed in the horizontal charge transfer portion 30. A space between adjacent charge transfer electrodes 112 is about 0.3 $\mu$m and a space between adjacent charge transfer electrodes 113 is about 0.5 $\mu$m. Further, as shown in the cross sections taken along the line I–I', a space between the last charge transfer electrode 112 of the vertical charge transfer portion 20 and the charge transfer electrode 113 of the horizontal charge transfer portion 30 is about 0.3 $\mu$m (FIG. 6(b)).

Thereafter, a mask material is formed on the whole surface of the wafer and a portion thereof corresponding to the area between the last charge transfer electrode 112 of the vertical charge transfer portion 20 and the charge transfer electrode 113 of the horizontal charge transfer portion 30 is selectively removed by photolithography to form a mask 116a. Thereafter, P type impurity (for example, boron) is ion injected into the N type semiconductor region 102 by using the mask 116a. Thus, the first N– type semiconductor region 106 having impurity density of about $9.7×10^{16}$ cm$^{-3}$ is formed (FIG. 6(c)).

Further, a mask material is further formed on the whole surface of the wafer and a portion thereof corresponding to the areas between the adjacent charge transfer electrodes 112 of the vertical charge transfer portion 20 are selectively removed by photolithography to form a mask 116b. Thereafter, P type impurity (for example, boron) is ion injected into the N type semiconductor region 102 by using the mask 116b. Thus, the second N– type semiconductor region 107 having impurity density of about $9.5×10^{16}$ cm$^{-3}$ is formed (FIG. 6(d)).

Further, a mask material is further formed on the whole surface of the wafer and a portion thereof corresponding to the areas between the adjacent charge transfer electrodes 113 of the horizontal charge transfer portion 30 are selectively removed by photolithography to form a mask 116c. Thereafter, P type impurity (for example, boron) is ion injected into the N type semiconductor region 102 by using the mask 116c. Thus, the third N– type semiconductor region 108 having impurity density of about $8.0×10^{16}$ cm$^{-3}$ is formed (FIG. 6(e)).

Thereafter, an inter-layer insulating film 114 is formed by using known technique (FIG. 6(f)) and the charge transfer device of the present invention is completed by connecting the charge transfer electrodes 112a to 112d of the vertical charge transfer portion and the charge transfer electrodes 113a and 113b of the horizontal charge transfer portion by a metal wiring 115 through the inter-layer insulating film 114 (FIG. 6(g)).

According to the solid state image pick-up device of this embodiment, the first N– type semiconductor region 106 which has impurity density of about 9.7× and becomes the connecting region between the vertical charge transfer portion 20 and the horizontal charge transfer portion 30 is formed, the second N– type semiconductor region 107 which has impurity density of about $9.5 \times 10^{16}$ cm$^{-3}$ is formed between the charge transfer electrodes 112 of the vertical charge transfer portion 20 and the third N– type semiconductor region 108 which has impurity density of about $8.0 \times 10^{16}$ cm$^{-3}$ is formed between the charge transfer electrodes 113 of the horizontal charge transfer portion 30.

That is, since, in this embodiment, the space between the charge transfer electrodes 113 of the horizontal charge transfer portion 30 is made wider than that between the charge transfer electrodes 112 of the vertical charge transfer portion 20 in order to reduce the power consumption in the horizontal charge transfer portion 30 whose driving frequency is high, uniform potential wells are formed in the respective regions by setting the impurity density of the region between the charge transfer electrodes 113 of the horizontal charge transfer portion 30 lower. Thus, the charge transfer efficiency is improved.

Figure 3:
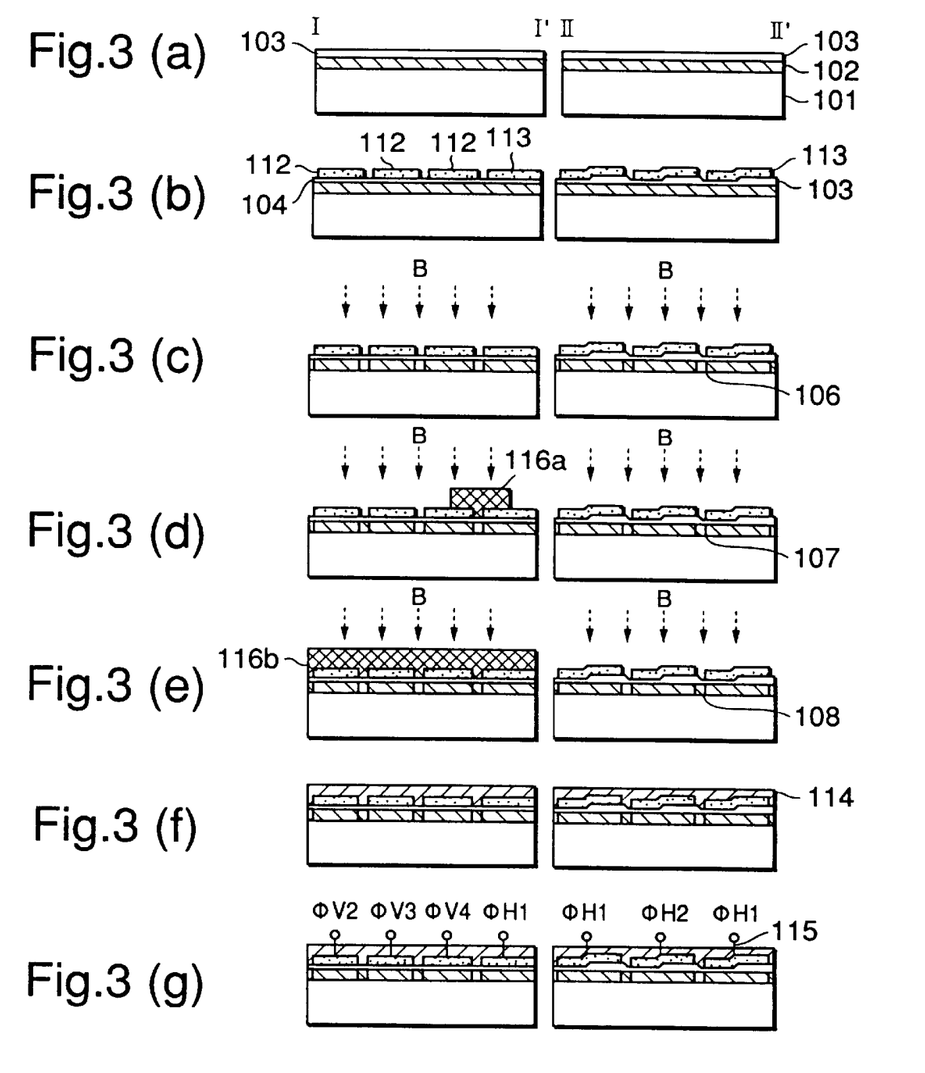
Figure 4:
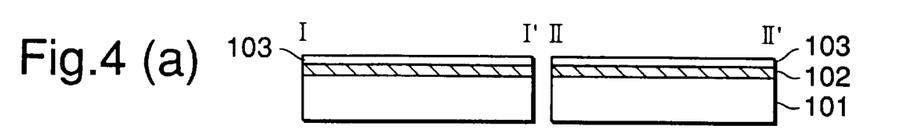

Incidentally, it may be possible to set the impurity densities in the respective regions by using the method shown in FIGS. 3 and 4.

A solid state image pick-up device according to a further embodiment of the present invention will be described with reference to FIG. 7.

Figure 7:
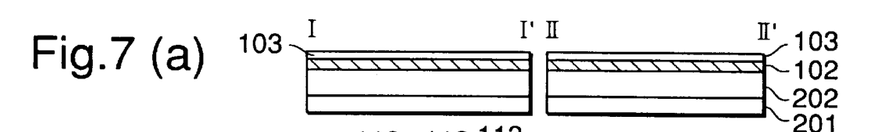

The solid state image pick-up device shown in FIG. 7 includes a P type well layer 202 having P type impurity density of about $1.0 \times 10^{16}$ cm$^{-3}$ formed in an N type semiconductor substrate 201 having impurity density of about $1.0 \times 10^{16}$ cm$^{-3}$, an N type semiconductor region 102 is formed in the P type well layer 202 and charge transfer electrodes 112 and 113 are formed on the P type well layer 202. This structure can be fabricated according to the method shown in FIGS. 2 or 6, except the step of forming the P type well layer 201 in the N type semiconductor substrate 201, as shown in FIGS. 7(a) to 7(g).

That is, the present invention can be also applied to the solid state image pick-up device using the well.

Although the respective embodiments described hereinbefore are the buried type charge transfer devices, the present invention can be also applied to the surface type charge transfer device.

Figure 8:
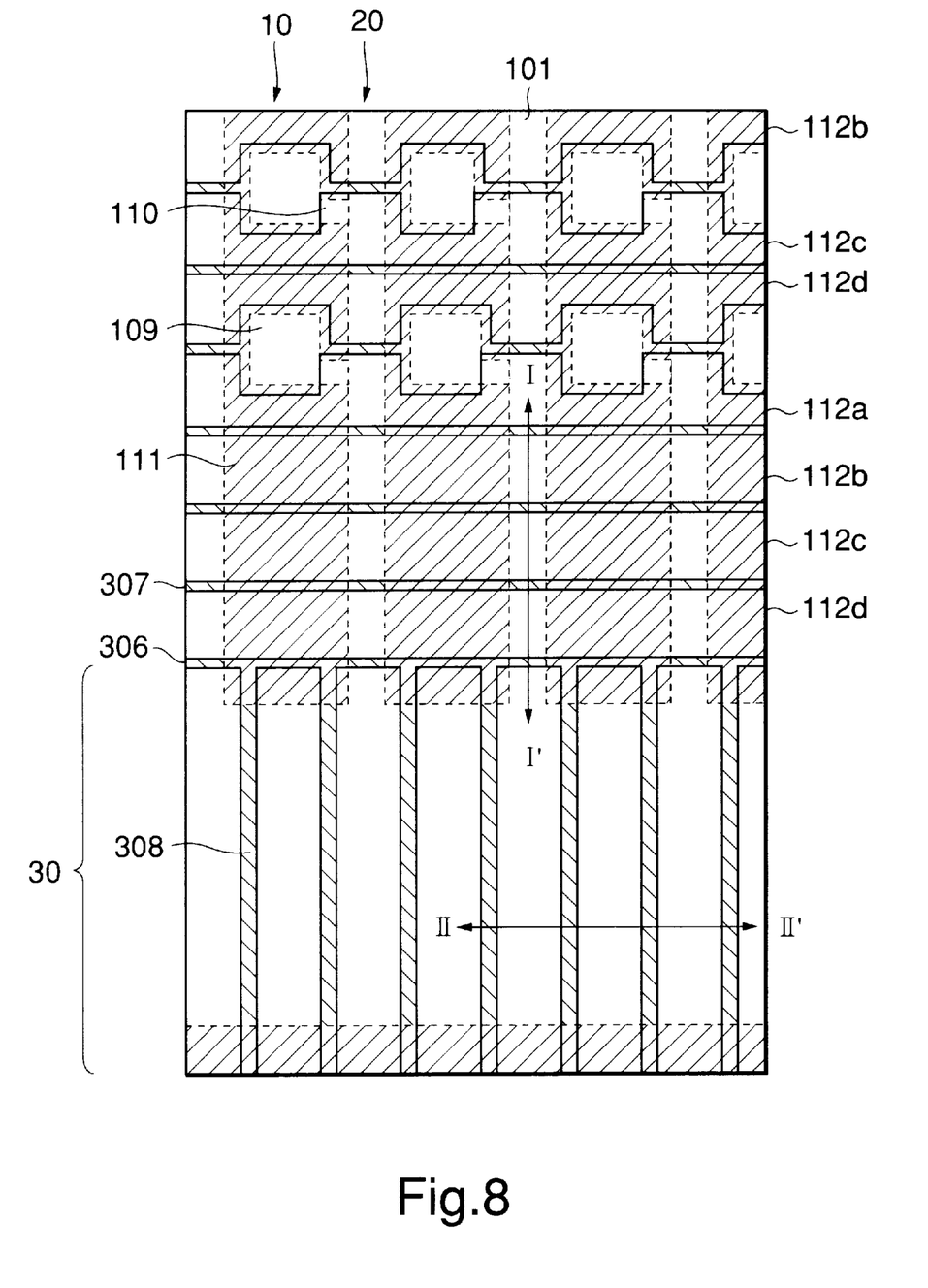
FIG. 8 is a plan view of a solid state image pick-up device according to a further embodiment of the present invention.

FIG. 8 shows the surface type charge transfer device to which the present invention is applied. In this embodiment, a space between adjacent charge transfer electrodes 112 of a vertical charge transfer portion 20 is different from that between the charge transfer electrodes 113 of the horizontal charge transfer portion 30. That is, the space between the charge transfer electrodes 112 of the vertical charge transfer portion is about 0.3 μm and the space between adjacent charge transfer electrodes 113 of the horizontal charge transfer portion 30 is about 0.5 μm. Incidentally, a space between the last charge transfer electrode 112 of the vertical charge transfer portion 20 and the charge transfer electrode 113 of the horizontal charge transfer portion 30 is about 0.3 μm. By setting the space between the charge transfer electrodes 113 of the horizontal charge transfer portion 30 wider than that between the charge transfer electrodes 112 of the vertical charge transfer portion 20, the power consumption of the horizontal charge transfer portion whose driving frequency is higher can be reduced.

Now, a manufacturing process of the solid state image pick-up device shown in FIG. 8 will be described with reference to a cross section of the vertical charge transfer portion taken along a line I–I' and a cross section of a horizontal charge transfer portion taken along a line II–II' shown in FIGS. 9(a) and 9(b), respectively.

Figure 9:
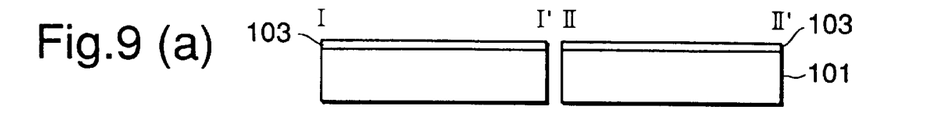
FIGS. 9(a) to 9(g) show an example of the manufacturing steps of the solid state image pick-up device shown in FIG. 8.

First, a first oxide film 103 having thickness of about 30 nm is formed in a P type semiconductor substrate 101 having impurity density of about $1.0 \times 10^{16}$ cm$^{-3}$ by thermal oxidation (FIG. 9(a)).

Then, a portion of the first oxide film 103 formed on the horizontal charge transfer portion 20 and a portion of the first oxide film 103 formed on the vertical charge transfer portion 30 are removed by photolithography and etching. Thereafter, a second oxide film 104 having thickness of about 60 nm is formed by thermal oxidation. With the latter thermal oxidation, the first oxide film 103 remaining on the horizontal charge transfer portion 30 is further grown to the thickness of about 70 nm.

Thus, the whole surface of the vertical charge transfer portion 20 is covered by the second oxide film 104 having thickness of about 60 nm and the portion of the horizontal charge transfer portion 30 the first oxide film 103 on which is removed by the etching is covered by the second oxide film 104 having thickness of about 60 nm and the remaining portion thereof the first oxide film 103 is not removed is covered by the first oxide film 103 grown to the thickness of about 70 nm.

Then, a polysilicon film is formed on the first oxide film 103 and the second oxide film 104 and, by patterning the polysilicon film, the charge transfer electrodes 112 on the vertical charge transfer portion 20 and the charge transfer electrodes 113 on the horizontal charge transfer portion 30 are formed. The space between the adjacent charge transfer electrodes 112 of the vertical charge transfer portion is about 0.3 μm and the space between the adjacent charge transfer electrodes 113 of the horizontal charge transfer portion 30 is about 0.5 μm. Further, as shown in by the cross section taken along the line I–I', the space between the last charge transfer electrode 112 of the vertical charge transfer portion 20 and the charge transfer electrode 113 of the horizontal charge transfer portion 30 is about 0.3 μm (FIG. 9(b)).

Then, a mask layer is formed on the whole surface of the wafer and a portion thereof corresponding to the area between the last charge transfer electrode 112 of the vertical charge transfer portion 20 and the charge transfer electrode 113 of the horizontal charge transfer portion 30 is selectively removed by photolithography to form a mask 116a. Thereafter, N type impurity (for example, phosphor) is ion injected into the P type semiconductor region 101 by using the mask 116a (FIG. 9(c)).

Further, a mask material is formed on the whole surface of the wafer again and a portion thereof corresponding to the areas between the adjacent charge transfer electrodes 112 of the vertical charge transfer portion 20 are selectively removed by photolithography to form a mask 116b. Thereafter, N type impurity (for example, phosphor) is ion injected into the P type semiconductor region 101 by using the mask 116b (FIG. 9(d)).

Then, a mask material is further formed on the whole surface of the wafer and a portion thereof corresponding to the areas between the adjacent charge transfer electrodes 113 of the horizontal charge transfer portion 30 are selectively removed by photolithography to form a mask 116c. Thereafter, N type impurity (for example, phosphor) is ion injected into the P type semiconductor region 101 by using the mask 116c (FIG. 9(e)).

Thereafter, an inter-layer insulating film 114 is formed by using known technique (FIG. 9(f)) and the charge transfer device of the present invention is completed by connecting the charge transfer electrodes 112a to 112d of the vertical charge transfer portion and the charge transfer electrodes 113a and 113b of the horizontal charge transfer portion by a metal wiring 115 through the inter-layer insulating film 114 (FIG. 9(g)).

According to the solid state image pick-up device of this embodiment, it is possible to form uniform potential wells in the regions between the charge transfer electrodes 112 of the vertical charge transfer portion 30, between the charge transfer electrodes 113 of the horizontal charge transfer portion 30 and in the connecting region between the vertical charge transfer portion 20 and the horizontal charge transfer portion 30, respectively, improving the charge transfer efficiency.

What is claimed is:

1. A solid state image pick-up device comprising:
   a plurality of first diffusion regions arranged in a vertical direction;
   a plurality of second diffusion regions arranged in a horizontal direction;
   a plurality of vertical charge transfer electrodes each formed on an associated one of said first diffusion regions;
   a plurality of horizontal charge transfer electrodes each formed on an associated one of said second diffusion regions;
   a plurality of third diffusion regions having a first impurity concentration each of which is located between said first diffusion regions; and
   a plurality of fourth diffusion regions having a second impurity concentration different from said first impurity concentration each of which is located between said second diffusion regions.

2. The solid state image pick-up device as claimed in claim 1, wherein said first impurity concentration is higher than said second impurity concentration.

3. The solid state image pick-up device as claimed in claim 1 further comprising a plurality of fifth diffusion regions having a third impurity concentration different from said second impurity concentration.

4. The solid state image pick-up device as claimed in claim 3, wherein said first impurity concentration is higher than said second impurity concentration and lower than said third impurity concentration.

5. The solid state image pick-up device as claimed in claim 3, wherein said first impurity concentration is higher than said second impurity concentration and substantially same as said third impurity concentration.

6. A solid state image pick-up device comprising:
   an opto-electric converting portion;
   a vertical charge transfer portion transferring electric charge supplied from said opto-electric converting portion; and
   a horizontal charge transfer portion transferring electric charge supplied from said vertical charge transfer portion;
   said vertical charge transfer portion having a plurality of vertical charge transfer electrodes arranged in a vertical direction with a first interval, a plurality of first diffusion regions located underneath said vertical charge transfer electrodes, and a plurality of second diffusion regions located between said first diffusion regions,
   said horizontal charge transfer portion having a plurality of horizontal charge transfer electrodes arranged in a horizontal direction with a second interval, a plurality of third diffusion regions located underneath said horizontal charge transfer electrodes, and a plurality of fourth diffusion regions located between said third diffusion regions,
   said first interval is narrower than said second interval.

7. The solid state image pick-up device as claimed in claim 6, wherein an impurity concentration of said second diffusion region is higher than an impurity concentration of said fourth diffusion region.

8. The solid state image pick-up device as claimed in claim 7, wherein an impurity concentration of said first diffusion region is substantially same as an impurity concentration of said third diffusion region.

* * * * *